(12) United States Patent
Takahashi

(10) Patent No.: US 8,373,149 B2
(45) Date of Patent: Feb. 12, 2013

(54) RESISTANCE CHANGE ELEMENT AND MANUFACTURING METHOD THEREOF

(75) Inventor: Kensuke Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 172 days.

(21) Appl. No.: 12/920,921

(22) PCT Filed: Apr. 7, 2009

(86) PCT No.: PCT/JP2009/057149
§ 371 (c)(1),
(2), (4) Date: Sep. 3, 2010

(87) PCT Pub. No.: WO2009/125777
PCT Pub. Date: Oct. 15, 2009

(65) Prior Publication Data
US 2011/0001110 A1  Jan. 6, 2011

(30) Foreign Application Priority Data
Apr. 7, 2008  (JP) ................. P2008-099565

(51) Int. Cl.
*H01L 45/00* (2006.01)
*H01L 21/14* (2006.01)
*H01L 29/12* (2006.01)

(52) U.S. Cl. ............ 257/2; 257/E21.006; 257/E45.003; 438/104

(58) Field of Classification Search ................. None
See application file for complete search history.

(56) References Cited

U.S. PATENT DOCUMENTS

| 7,521,704 | B2 * | 4/2009 | Lee et al. ............................ 257/2 |
| 7,635,628 | B2 * | 12/2009 | Khang et al. .................. 438/264 |
| 7,936,044 | B2 * | 5/2011 | Kim et al. ...................... 257/529 |
| 8,164,130 | B2 * | 4/2012 | Seo et al. ...................... 257/298 |
| 2005/0247921 | A1 * | 11/2005 | Lee et al. ............................ 257/2 |
| 2006/0054950 | A1 * | 3/2006 | Baek et al. .................... 257/295 |
| 2006/0098472 | A1 * | 5/2006 | Ahn et al. ..................... 365/145 |
| 2007/0267675 | A1 * | 11/2007 | Cho et al. ...................... 257/306 |

FOREIGN PATENT DOCUMENTS

| JP | 2004349690 A | 12/2004 |
| JP | 2005317976 A | 11/2005 |
| JP | 2006210882 A | 8/2006 |
| JP | 2007173515 A | 7/2007 |
| JP | 2008016854 A | 1/2008 |

(Continued)

OTHER PUBLICATIONS

Seo, S., M. J. Lee, D. H. Seo, E. J. Jeoung, D.-S. Suh, Y. S. Joung, I. K. Yoo, I. R. Hwang, S. H. Kim, I. S. Byun, J.-S. Kim, J. S. Choi, and B. H. Park. "Reproducible Resistance Switching in Polycrystalline NiO Films." Applied Physics Letters 85.23 (2004): 5655.*

(Continued)

*Primary Examiner* — Thomas L Dickey
*Assistant Examiner* — Joseph Schoenholtz

(57) ABSTRACT

A resistance change element including: a lower electrode formed on at least one of a semiconductor and insulating substrate; a resistance change material layer formed on the lower electrode and including a transition metal oxide as a major component; and an upper electrode formed on the resistance change material layer. The resistance change material layer is formed of a nickel oxide containing nickel vacancy and having a higher oxygen concentration than a stoichiometric composition, and has a stacked structure with different composition ratios.

2 Claims, 14 Drawing Sheets

FOREIGN PATENT DOCUMENTS

| JP | 2009105383 A | 5/2009 |
|---|---|---|
| WO | 2009072213 A | 6/2009 |

OTHER PUBLICATIONS

Park, Jae-Wan, Jong-Wan Park, Kyooho Jung, Min Kyu Yang, and Jeon-Kook Lee. "Influence of Oxygen Content on Electrical Properties of NiO Films Grown by Rf Reactive Sputtering for Resistive Random-access Memory Applications." Journal of Vacuum Science & Technology B: Microelectronics and Nanometer Structures 24.5 (2006): 2205.*

Lee, Ming-Daou, Chia-Hua Ho, Chi-Kuen Lo, Tai-Yen Peng, and Yeong-Der Yao. "Effect of Oxygen Concentration on Characteristics of NiOx Based Resistance Random Access Memory." IEEE Transactions on Magnetics 43.2 (2007): 939-42.*

Lee, Myoung-Jae, Chang Bum Lee, Dongsoo Lee, Seung Ryul Lee, Jihyun Hur, Seung-Eon Ahn, Man Chang, Young-Bae Kim, U-In Chung, Chang-Jung Kim, Dong-Sik Kim, and Hosun Lee. "Improved Resistive Switching Reliability in Graded NiO Multilayer for Resistive Nonvolatile Memory Devices." IEEE Electron Device Letters 31.7 (2010): 725-27.*

Yoshida, Chikako, Kentaro Kinoshita, Takahiro Yamasaki, and Yoshihiro Sugiyama. "Direct Observation of Oxygen Movement during Resistance Switching in NiO/Pt Film." Applied Physics Letters 93.4 (2008): 042106.*

International Search Report for PCT/JP2009/057149 mailed Jul. 14, 2009.

J. F. Gibbons et al., "Switching Properties of Thin NiO Films", Solid-State Electronics, Pergamon Press, vol. 7, 1964, pp. 785-797.

D. C. Kim et al., "Electrical observations of filamentary conductions for the resistive memory switching in NiO films", Applied Physics Letters, vol. 88, 2006, pp. 202102-1~3.

* cited by examiner

RESISTANCE CHANGE ELEMENT AND MANUFACTURING METHOD THEREOF

TECHNICAL FIELD

The present invention relates to a resistance change element and a manufacturing method thereof.

This application is the National Phase of PCT/JP2009/057149, filed Apr. 7, 2009, which claims priority to and the benefit of Japanese Patent Applications No. 2008-099565 filed on Apr. 7, 2008, the content of which is incorporated herein by reference.

BACKGROUND ART

In the current market, non-volatile memories such as flash memories, SONOS memories, and so on are widely used. These non-volatile memories employ a technique of varying a threshold voltage of a semiconductor transistor using charges accumulated in an insulating layer disposed over a channel part. In order to implement a large-capacity memory, it is essential to miniaturize the transistor. However, when the insulating layer in which charges are stored and retained is thinned, a leak current is increased to decrease charge retention capability. For this reason, it is difficult to implement a charge accumulation transistor type non-volatile memory having a large capacity.

Studies have been conducted to further increase capacity by allowing a transistor to have only a switching function of selecting a memory cell to and from which data is written and read, separating a memory element such as a DRAM, and miniaturizing the transistor and the memory element separately. As a technique of realizing continuous miniaturization of the non-volatile memory function, a resistance change element using an electronic element in which a value of electrical resistance is exchanged by two levels or more by any electrical stimulus has been developed. When charges are accumulated in a capacity (capacitance) such as that of a DRAM, an accumulated charge amount is reduced due to the miniaturization such that a reduction in signal voltage cannot be avoided. In many cases, an electrical resistance generally has a finite value, even when it is miniaturized. Awareness of a theory of changing a resistance value and existence of a material are advantageous to continuous miniaturization. Such a resistance change element is used for a switch configured to switch between a set (ON) state and a reset (OFF) state. For example, the resistance change element is applied to a converter (selector) of an interconnection constitution in an LSI.

A plurality of conventional techniques of changing electrical resistances using electrical stimuli are known. Among the techniques, the most widely researched technique involves a memory device that uses a pulse current applied to a chalcogenide semiconductor to change crystalline phases (amorphous or crystalline) to generate a 2 to 3 digit difference in electrical resistance between the crystalline phases. In general, the memory device is referred to as a phase change memory. Meanwhile, it is well known that a change in resistance occurs when a large voltage or current is applied even in a metal/metal oxide/metal (hereinafter, referred to as "MIM") structure in which a metal oxide is disposed between electrodes.

In the 1950s and 1960s, phenomena of resistance values varying depending on the voltage or current had been researched and reported on various materials.

For example, Non-Patent Document 1 discloses a resistance change element using a nickel oxide (NiO).

FIG. 1 is a cross-sectional view of a conventional MIM resistance change element. The resistance change element includes a lower electrode 300, a resistance change material layer 200 formed on the lower electrode 300, and an upper electrode 100 formed on the resistance change material layer 200.

Current/voltage characteristics of the MIM resistance change element are shown in FIGS. 2A and 2B. The resistance change element maintains the characteristics in a high resistance OFF state or a low resistance ON state in a non-volatile manner even when power is turned off. Then, depending on necessity, a predetermined voltage/current stimulus is applied to switch a resistance state.

FIGS. 2A and 2B show examples of current/voltage characteristics in an ON state and an OFF state. When a set voltage of Vt2 is applied to an element in a high resistance OFF state shown in dotted lines of FIGS. 2A and 2B, the element is changed to a low resistance ON state as shown by an arrow D1 of FIG. 2A so that electrical characteristics represented by solid lines of FIGS. 2A and 2B are shown. Next, when a reset voltage of Vt1 is applied to an element in an ON state shown in solid lines of FIGS. 2A and 2B, the element is changed to a high resistance OFF state as shown by an arrow D2 of FIG. 2A so that electrical characteristics represented by dotted lines of FIGS. 2A and 2B are returned.

The electrical characteristics shown by the dotted lines and solid lines of FIGS. 2A and 2B can be repeatedly changed. These characteristics may be used for a non-volatile memory cell for circuit conversion or a non-volatile switch.

As characteristics of a portion R1 of FIG. 2B are shown, a large current is needed to reset the element. In addition, as characteristics of a portion R2 of FIG. 2B are shown, when a reset current is decreased, an ON resistance is increased.

In the phase change memory, in general, a change in volume caused by a change in crystalline phase is great, and local heating for a short time of several tens of nanoseconds at hundreds of ° C. is needed for a change in crystalline phase. For this reason, when the element is used as a memory element or a switch element, it is difficult to control the temperature of the phase change material. Meanwhile, in the MIM resistance change element, it is not necessary to heat the element to hundreds of ° C. For this reason, a resistance change type memory device using oxides of transition metals such as Cu, Ti, Ni, Cu, Mo, and so on, as resistance change materials, which has attracted attention again in recent times, has been proposed. In the transition metal oxide, a current path 400 referred to as a filament of the transition metal oxide shown in FIG. 3 is formed. It has been reported that the current path 400, the upper electrode 100 and the lower electrode 300 are coupled to or separated from each other to cause a change in resistance.

For example, Patent Document 1 and Non-Patent Document 2 disclose a resistance change type memory device using a nickel oxide as a metal oxide layer. In particular, in Non-Patent Document 2, among nickel oxides, a current path 400 referred to as a filament shown in FIG. 3 is formed. In addition, Non-Patent Document 2 discloses that a resistance of the resistance change element is changed by a connection state of the current path 400, the upper electrode 100 and the lower electrode 300.

However, the above techniques have the following problems.

First, the MIM resistance change element requires a forming process of switching an initial OFF state to an ON state. Conventionally, in order to perform the forming process, it is necessary to apply a voltage of 4 V or more to the MIM resistance change element. When these switch elements are mounted together with the LSI, it is necessary to operate the switch elements at 3 V or less, and thus, low voltage operation of the elements is required. The forming voltage can be lowered when a thickness of the resistance change material layer is reduced. However, when the resistance change material is thinned, a leak current in an OFF state is increased, and thus, it is impossible to obtain a high current ratio of the ON state and the OFF state required to the switch element. That is, in the conventional art, it has been difficult to realize both performance of the forming process at a low voltage and the high current ratio of the ON state and the OFF state, because they are in a trade-off relationship.

Second, the transition metal oxide is likely to include oxygen vacancy or metal vacancy. These become causes of a leak current path. That is, if there is a large amount of oxygen vacancy or metal vacancy in a layer, when the element is repeatedly operated, new vacancy occurs in the resistance change material due to the leak current. Moreover, the leak current is increased, which decreases a resistance in an OFF state. As a result, a reduction in resistance ratio of the ON/OFF state of the element and imbalance of the element characteristics cause reliability of the element to deteriorate.

Third, in the MIM resistance change element, it is possible to further increase the current ratio of the ON state and the OFF state by performing miniaturization. A filament which forms a current path in an ON state has a very small diameter. For this reason, a current value in an ON state is scarcely influenced by the area of the element. Meanwhile, a resistance value in an OFF state depends on the area of the element. That is, when miniaturization of the element progresses, the resistance value in the ON state is constant, but the resistance value in the OFF state increases in reverse proportion to the element area. As a result, a resistance ratio of the ON state and the OFF state increases. However, when miniaturization of the MIM resistance change element progresses, the yield of the MIM resistance change element having switching operation characteristics decreases. This is because miniaturization provides a remarkable influence on imbalance of a grain diameter, a composition, and so on of the resistance change material.

PRIOR ART DOCUMENT

Patent Document 1: Japanese Unexamined Patent Publication, First Publication No. 2006-210882
Non-Patent Document 1: Solid State Electronics Vol. 7, p. 785:797, 1964
Non-Patent Document 2: Applied physics letters Vol. 88, p. 202102, 2006

DISCLOSURE OF INVENTION

Problem to be Solved by the Invention

The present invention has been achieved in view of the above circumstances, and it is an object of the present invention to provide a resistance change element capable of implementing a forming process at a low voltage, realizing reliability for a long time and suppressing imbalance of an element having miniaturized elements, and a manufacturing method thereof.

Means for Solving the Problem (1) The present invention has been made to solve the above-described problems. According to an aspect of the present invention, there is provided a resistance change element including: a lower electrode formed on at least one of a semiconductor and insulating substrate; a resistance change material layer formed on the lower electrode and including a transition metal oxide as a major component; and an upper electrode formed on the resistance change material layer, wherein the resistance change material layer is formed of a nickel oxide containing nickel vacancy and having a higher oxygen concentration than a stoichiometric composition, and has a stacked structure with different composition ratios.

(2) In the resistance change element according to the aspect of the present invention, the resistance change material layer may include: a first layer in contact with the lower electrode; and a second layer formed on the first layer and in contact with the upper electrode, wherein the second layer may have a higher oxygen concentration than the first layer.

(3) In the resistance change element according to the aspect of the present invention, the resistance change material layer may include: a second layer in contact with the lower electrode; and a first layer formed on the second layer and in contact with the upper electrode, wherein the second layer may have a higher oxygen concentration than the first layer.

(4) In the resistance change element according to the aspect of the present invention, the resistance change material layer may include: a first layer in contact with the lower electrode; a second layer formed on and in contact with the first layer; and a third layer formed on the second layer and in contact with the upper electrode, wherein the first layer and the third layer may have the same oxygen concentration, and the second layer may have a higher oxygen concentration than the first layer and the third layer.

In the aspect of the present invention, the resistance change material have a three-layer structure, and the oxygen concentration adjacent to the electrode is low, that is, the atomic density is set to a substantially stoichiometric composition. For this reason, it is possible to suppress the damage to the electrode upon formation thereof and reliability deterioration of the MIM resistance change element due to diffusion of the electrode metal.

(5) In the resistance change element according to the aspect of the present invention, when a composition ratio of the resistance change material layer is represented as $Ni_xO_{1-x}$ ($0<X<1$), the first layer may have a composition ratio of $0.45<X<0.49$, and the second layer may have a composition ratio of $0.40<X<0.47$.

(6) In the resistance change element according to the aspect of the present invention, when a composition ratio of the resistance change material layer is represented as $Ni_xO_{1-x}$ ($0<X<1$), the first layer and the third layer may have a composition ratio of $0.45<X<0.49$, and the second layer may have a composition ratio of $0.40<X<0.47$.

(7) According to another aspect of the present invention, there is provided a method of manufacturing a resistance change element, including: forming a lower electrode on at least one of a semiconductor and insulating substrate; forming a resistance change material layer including a transition metal oxide as a major component on the lower electrode, wherein the resistance change material layer is formed of a nickel oxide containing nickel vacancy and having a higher oxygen concentration than a stoichiometric composition, and has a stacked structure with different composition ratios; and forming an upper electrode on the resistance change material layer.

Effect of the Invention

According to the present invention, a resistance change material layer composed of a nickel oxide can substantially suppress a leak current in an OFF state and realize a high current ratio of an ON state and an OFF state, even in comparison with a case in which a composition is uniform in a depth direction and the nickel oxide is thinned to reduce a forming voltage. Further, even when the element is miniaturized, imbalance of switching characteristics can be suppressed.

BEST MODE FOR CARRYING OUT THE INVENTION

An embodiment of the present invention relates to a resistance change type non-volatile memory device having a metal/resistance change material/metal structure, in which a resistance change material layer is disposed between metal electrodes. A phenomenon that a resistance value of the resistance change material varies is caused by oxygen vacancy or metal vacancy included in the resistance change material, i.e., a transition metal oxide. By interposing the oxygen vacancy or metal vacancy included in the transition metal oxide, oxygen or metal may be diffused or extracted by an electric field applied to the transition metal oxide. As a result, a current path (filament) is formed in the transition oxide layer.

Figure 1:
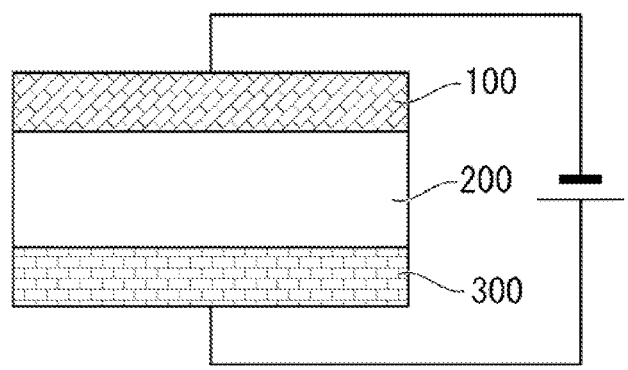
FIG. 1 is a cross-sectional view of a conventional MIM resistance change element.
Figure 2A:
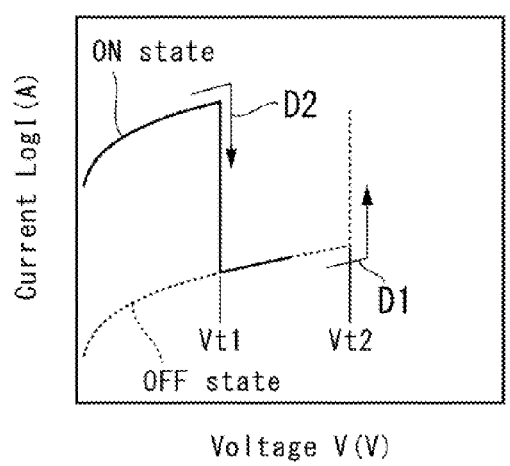
FIG. 2A shows resistance change characteristics of the conventional MIM resistance change element.
Figure 2B:
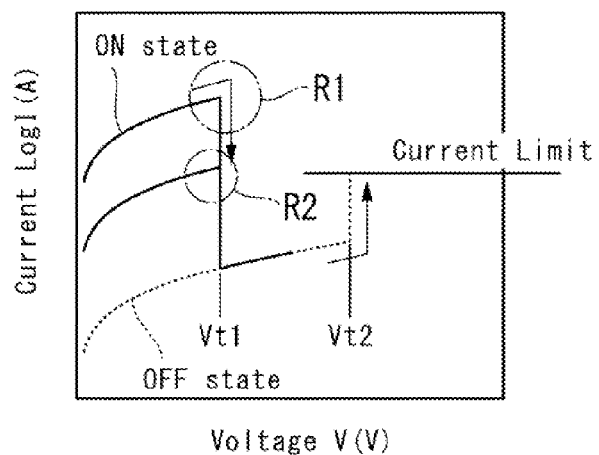
FIG. 2B shows resistance change characteristics of the conventional MIM resistance change element.
Figure 3:
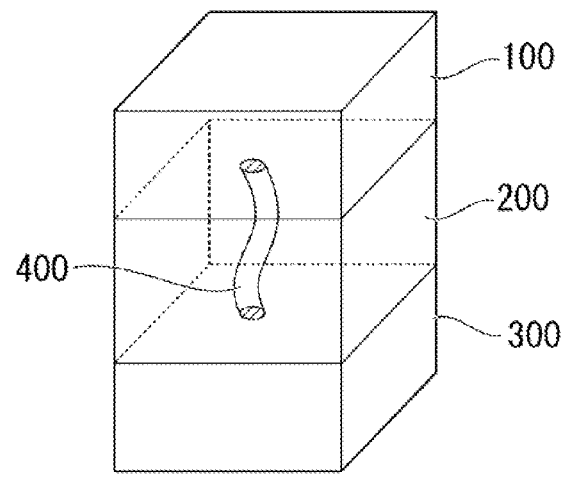
FIG. 3 is a perspective view of the conventional MIM resistance change element.
Figure 4A:
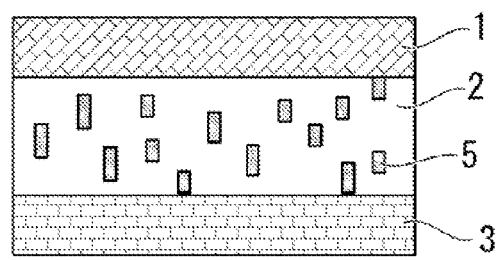
FIG. 4A is a cross-sectional view showing a process of forming a current path of an MIM resistance change element.
Figure 4B:
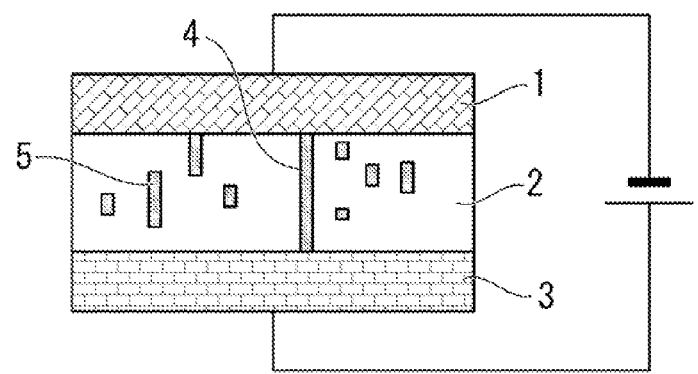
FIG. 4B is a cross-sectional view showing a process of forming a current path of the MIM resistance change element.

That is, as shown in FIG. 4A, a resistance change material layer 2, which is a transition metal oxide thin layer including oxygen vacancy or metal vacancy 5, is uniformly formed in the layer. As shown in FIG. 4B, the resistance change material layer 2 is disposed between an upper electrode 1 and a lower electrode 3, and an electric field is applied thereto. Therefore, oxygen or metal is diffused in and extracted from the resistance change material layer 2 through the oxygen vacancy or metal vacancy 5. As a result, a current path (filament) 4 enabling electron conduction or hole conduction is formed between the upper electrode 1 and the lower electrode 3.

The electric field is applied and the current flows so that the current path 4 is reoxidized by extraction of the metal, or the current path 4 formed by the metal vacancy 5 is filled with the metal again so that the current path 4 is cut. Such a phenomenon is repeated to cause a change in resistance of the transition metal oxide. For example, in Patent Document 1 and Non-Patent Document 2, a resistance change type memory device using a nickel oxide as the metal oxide layer has been proposed. In general, the nickel oxide is NiO in which Ni and O have a stoichiometric composition ratio of 1:1. However, when nickel vacancy occurs, a composition ratio of oxygen is slightly larger than that of Ni. The filament formed in the nickel oxide is extracted through Ni vacancy, and a current path is formed by hole conduction.

Figure 5A:
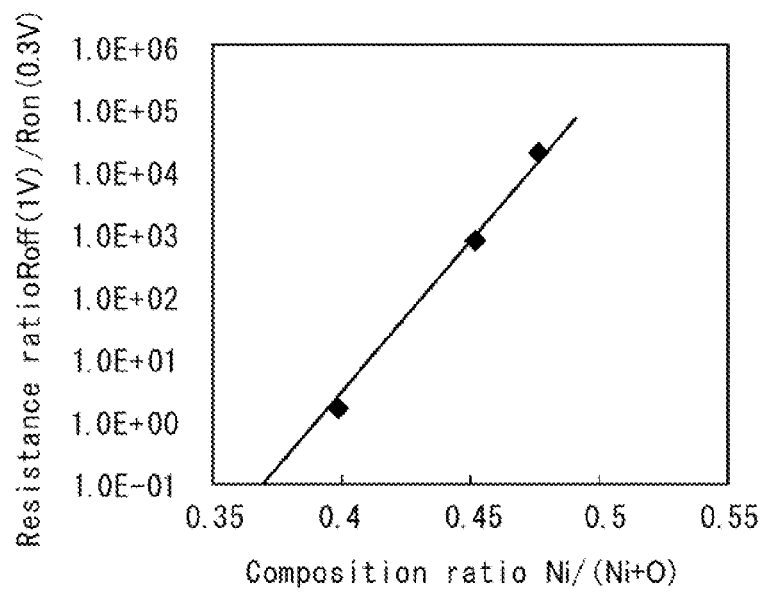
FIG. 5A is a graph showing the relationship between a composition ratio and a resistance ratio of the MIM resistance change element.
Figure 5B:
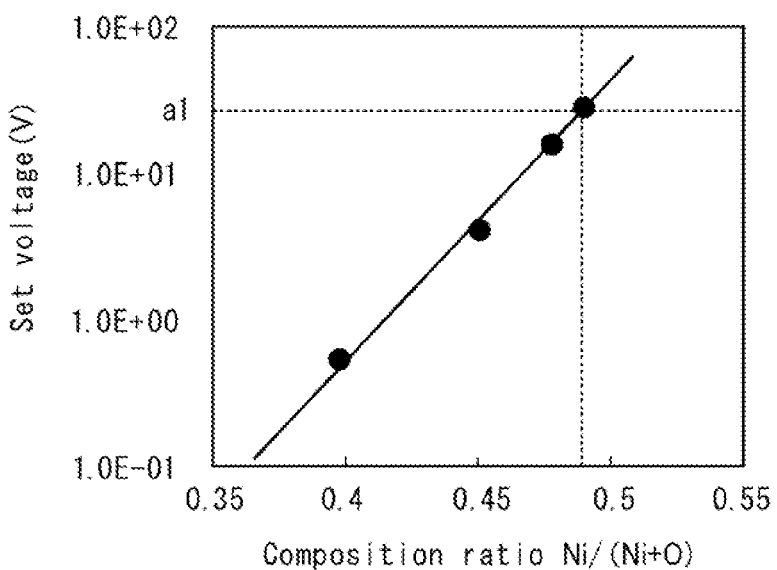
FIG. 5B is a graph showing the relationship between a composition ratio and a set voltage of the MIM resistance change element.

For this reason, the characteristics of the MIM resistance change element using the nickel oxide (NiO) as the resistance change material depend on a composition of the nickel oxide, i.e., an amount of Ni vacancy. FIGS. 5A and 5B are graphs showing dependence of the NiO layer composition of resistances in ON/OFF states and a forming voltage (set voltage) in a switch element in which a NiO layer is applied to the MIM resistance change element. As shown in FIG. 5B, as the amount of Ni vacancy is increased, that is, as a composition ratio of oxygen is raised, the NiO layer can be switched to the ON state at a lower set voltage. When the composition of the NiO layer is a completely stoichiometric composition and there is no Ni vacancy in the layer, a change in resistance of the NiO layer cannot occur. When a voltage for a set operation is continuously applied to the NiO layer, dielectric breakdown occurs. In addition, in FIG. 5B, a voltage a1 represents a voltage at which the dielectric breakdown occurs.

Further, as shown in FIG. 5A, a resistance ratio of the ON/OFF states increases proportionally as an amount of Ni vacancy decreases, i.e., as a composition ratio of oxygen is lowered. When the amount of Ni vacancy in the NiO layer is too much, i.e., when the composition ratio of oxygen is too high, a leak current in the OFF state increases to make a low resistance state. In addition, a resistance ratio of the ON/OFF states cannot be substantially obtained, and thus, the element cannot be operated as a switch. As described above, it has been difficult to realize both performance of the forming process at a low voltage and the high current ratio of the ON state and the OFF state, because they are in a trade-off relationship.

Figure 6A:
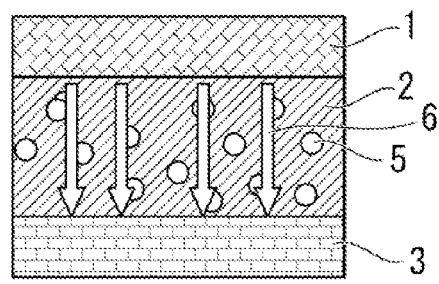
FIG. 6A is a cross-sectional view showing a leak current generating mechanism of the MIM resistance change element.

As described above, composition dependence of the NiO layer having switching characteristics will be described with reference to a model shown in FIGS. 6A to 6C. That is, as shown in FIG. 6A, as the metal vacancy 5, Ni vacancy, increases, i.e., the composition ratio of oxygen is raised, the filament can be more easily formed. For this reason, the NiO layer can be switched to the ON state at a lower set voltage. However, when the metal vacancy 5 increases, a leak current 6 increases due to these defects to decrease a resistance value in the OFF state. For this reason, a substantial resistance ratio of the ON/OFF states cannot be obtained.

Figure 6B:
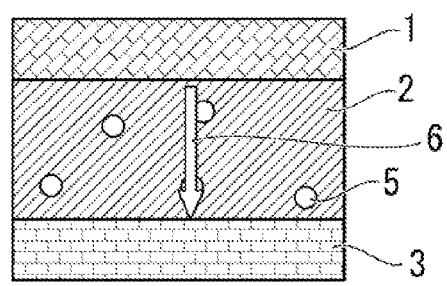
FIG. 6B is a cross-sectional view showing a leak current generating mechanism of the MIM resistance change element.

Meanwhile, as shown in FIG. 6B, as the metal vacancy 5 decreases, i.e., as the composition ratio of oxygen is lowered, the leak current 6 flowing through the metal vacancy 5 in the NiO layer decreases. As a result, a high resistance value in the OFF state can be realized. However, when the metal vacancy 5 in the NiO layer decreases, a higher voltage is needed to form the filament. As a result, a forming voltage becomes high. When the composition of the NiO layer is a completely stoichiometric composition and there is no metal vacancy 5 in the layer, a change in resistance of the NiO layer cannot occur. When a voltage for a set operation is continuously applied to the NiO layer, dielectric breakdown occurs.

Figure 6C:
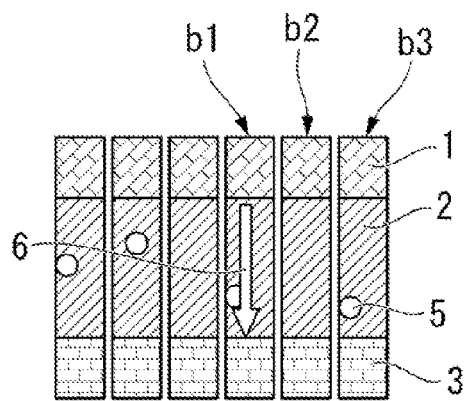
FIG. 6C is a cross-sectional view showing problems of the miniaturized MIM resistance change element.

As shown in FIG. 6C, when the MIM resistance change element is miniaturized, a difference in the amount of Ni vacancy in the NiO layer included in each element occurs to cause imbalance of element characteristics. In addition, in FIG. 6C, an element b1 represents an element which has a large amount of leak current and does not perform an OFF operation. Further, an element b2 represents an element which does not perform an ON operation. Furthermore, an element b3 represents an element which performs a switching operation.

Figure 7A:
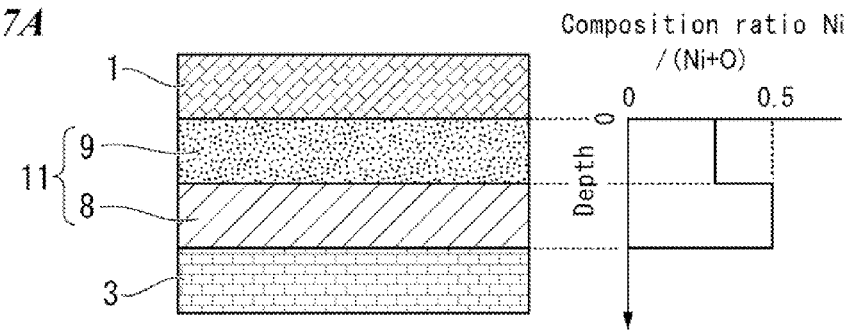
FIG. 7A is a cross-sectional view of an MIM resistance change element according to an embodiment of the present invention.
Figure 7B:
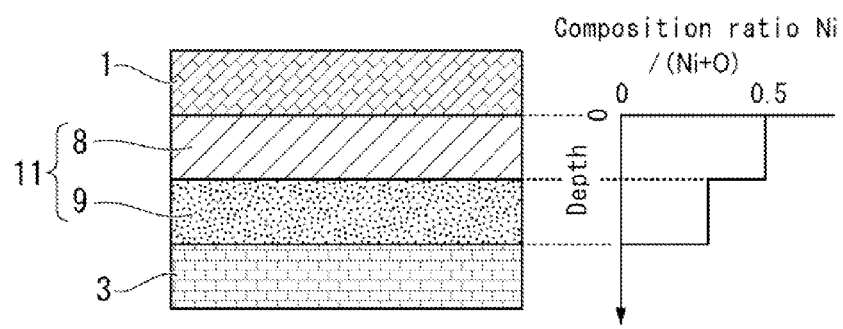
FIG. 7B is a cross-sectional view of an MIM resistance change element according to another embodiment of the present invention.

Hereinafter, an embodiment of the present invention will be described with reference to the accompanying drawings. FIGS. 7A and 7B are cross-sectional views showing a basic element structure of a semiconductor memory device according to an embodiment of the present invention. The embodiment relates to an MIM resistance change non-volatile semiconductor memory device having a metal/resistance change material/metal structure, in which a metal oxide is disposed between electrodes. The non-volatile semiconductor memory device includes a lower electrode 3 formed on a semiconductor or insulating substrate, or an interlayer insulating layer of an LSI interconnection, a resistance change material layer 11 having a nickel oxide formed on the lower electrode 3 as a main component, and an upper electrode 1 formed on the resistance change material layer 11.

The composition of the nickel oxide used as the resistance change material layer 11 has an oxygen concentration higher than a stoichiometric composition. The resistance change material layer 11 formed of the nickel oxide has a stacked structure with different composition ratios. As shown in FIG. 7A, the resistance change material layer 11 formed of the nickel oxide has a two-layer structure including a first layer 8 in contact with the lower electrode 3, and a second layer 9 formed on the first layer 8 and in contact with the upper electrode 1. The second layer 9 has a higher oxygen concentration than the first layer 8. That is, as shown in a right side of FIG. 7A, a composition ratio of Ni/(Ni+O) of the second layer 9 is lower than a composition ratio (=0.5) of the first layer 8.

In addition, instead of FIG. 7A, the constitution shown in FIG. 7B may be provided. That is, the resistance change material layer 11 formed of the nickel oxide may have a two-layer structure including a second layer 9 in contact with the lower electrode 3, and a first layer 8 formed on the second layer 9 and in contact with the upper electrode 1. The second layer 9 has a higher oxygen concentration than the first layer 8. That is, as shown in a right side of FIG. 7B, a composition ratio of Ni/(Ni+O) of the second layer 9 is lower than a composition ratio (=0.5) of the first layer 8.

When the composition ratio in the nickel oxide is represented as $Ni_xO_{1-x}$ (0<X<1), the first layer 8 has a composition ratio of 0.45<X<0.49 and the second layer 9 has a composition ratio of 0.40<X<0.47 in a case where the resistance change material layer 11 formed of the nickel oxide has a two-layer structure.

More preferably, the composition of the nickel oxide is set such that the composition ratio of the first layer 8 has a range of 0.48<X<0.49 and the composition ratio of the second layer 9 has a range of 0.450<X<0.475.

Figure 8:
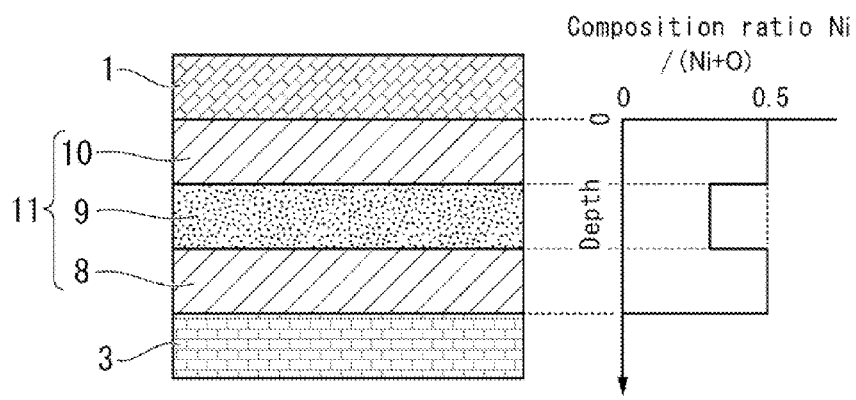
FIG. 8 is a cross-sectional view of an MIM resistance change element according to still another embodiment of the present invention.

In addition, instead of FIG. 7A, the constitution shown in FIG. 8 may be provided. That is, the resistance change material layer 11 formed of the nickel oxide may have a three-layer structure including a first layer 8 in contact with the lower electrode 3, a second layer 9 formed on and in contact with the first layer 8, and a third layer 10 formed on the second layer 9 and in contact with the upper electrode 1.

The first layer 8 and the third layer 10 have the same oxygen concentration. The second layer 9 has a higher oxygen concentration than the first layer 8 and the third layer 10. That is, as shown in a right side of FIG. 8, a composition ratio of Ni/(Ni+O) of the second layer 9 is lower than a composition ratio (=0.5) of the first layer 8 and the third layer 10.

Here, the resistance change material layer 11 formed of the NiO layer has a three-layer structure in which the third layer 10 and the first layer 8 adjacent to the upper electrode 1 and the lower electrode 3 have a substantially stoichiometric composition. As a result, damage to the electrodes upon formation thereof and reliability deterioration of the MIM resistance change element due to diffusion of the electrode metal in the NiO layer can be suppressed by increasing atomic density.

When the composition ratio of the resistance change material layer 11 formed of the nickel oxide is represented as $Ni_xO_{1-x}$ (0<X<1), the first layer 8 and the third layer 10 have a composition ratio of 0.45<X<0.49 and the second layer 9 has a composition ratio of 0.40<X<0.47. More preferably, the first layer 8 and the third layer 10 have a composition ratio of 0.48<X<0.49 and the second layer 9 has a composition ratio of 0.450<X<0.475.

Figure 10:
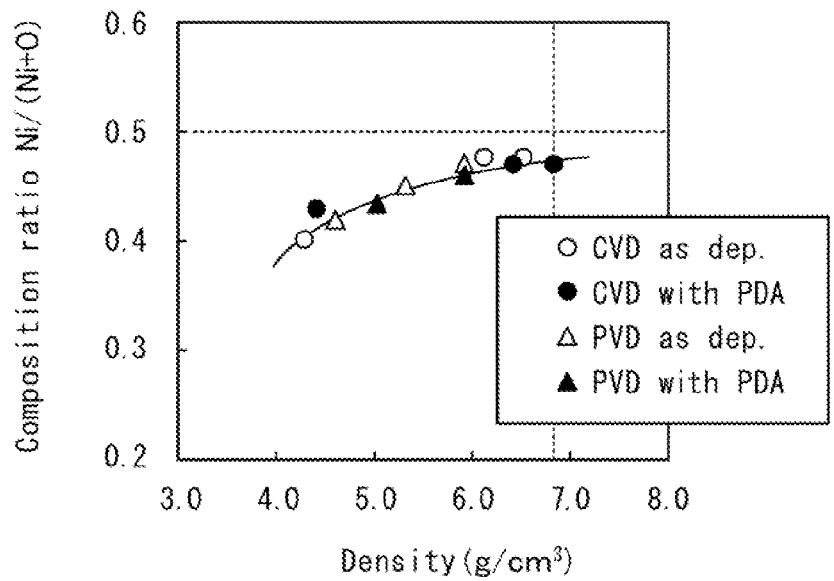
FIG. 10 is a graph showing the relationship between a density and a composition ratio of a nickel oxide according to the embodiment of the present invention.

The relationship between the composition ratio and the atomic density of the nickel oxide is unambiguously determined, regardless of a film forming method such as chemical vapor deposition (CVD), physical vapor deposition (PVD), and so on, or post deposition annealing (PDA). As shown in FIG. 10, as an oxygen concentration of the composition ratio increases, the atomic density of the nickel oxide is lowered. This is because Ni vacancy is generated in the nickel oxide of the stoichiometric composition. Therefore, when the resistance change material layer 11 formed of the nickel oxide has a two-layer structure and a composition ratio of $Ni_xO_{1-x}$ (0<X<1), the atomic density may be set as follows. That is, when the composition ratio of the first layer 8 has a range of 0.45<X<0.49 and the composition ratio of the second layer 9 has a range of 0.40<X<0.47, the atomic density of the first layer 8 may be set to a range of 5.2 to 6.9 g/cm$^3$ and the atomic density of the second layer 9 may be set to a range of 4.2 to 6.3 g/cm$^3$.

More preferably, when the composition ratio of the first layer 8 has a range of 0.48<X<0.49 and the composition ratio of the second layer 9 has a range of 0.450<X<0.475, the atomic density of the first layer 8 may be set to a range of 6.1 to 6.9 g/cm$^3$ and the atomic density of the second layer 9 may be set to a range of 5.2 to 6.5 g/cm$^3$.

In addition, when the resistance change material layer 11 formed of the nickel oxide has a three-layer structure including the first layer 8 in contact with the lower electrode 3, the second layer 9 formed on and in contact with the first layer 8, and the third layer 10 formed on the second layer 9 and in contact with the upper electrode 1, and the composition ratio of the resistance change material layer 11 formed of the nickel oxide is represented as $Ni_xO_{1-x}$ (0<X<1), the atomic density may be set as follows. That is, when the composition ratio of the first layer 8 and the third layer 10 has a range of 0.45<X<0.49 and the composition ratio of the second layer 9 has a range of 0.40<X<0.47, the atomic density of the first layer 8 and the third layer 10 may be set to a range of 5.2 to 6.9 g/cm$^3$ and the atomic density of the second layer 9 may be set to a range of 4.2 to 6.3 g/cm$^3$.

More preferably, when the composition ratio of the first layer 8 and the third layer 10 has a range of 0.48<X<0.49 and the composition ratio of the second layer 9 has a range of 0.450<X<0.475, the atomic density of the first layer 8 and the third layer 10 may be set to a range of 6.1 to 6.9 g/cm$^3$ and the atomic density of the second layer 9 may be set to a range of 5.2 to 6.5 g/cm$^3$.

Figure 9A:
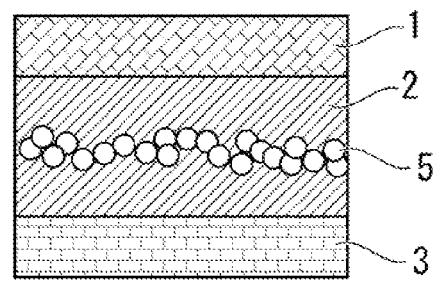
FIG. 9A is a view for explaining an effect according to the embodiment of the present invention.
Figure 9B:
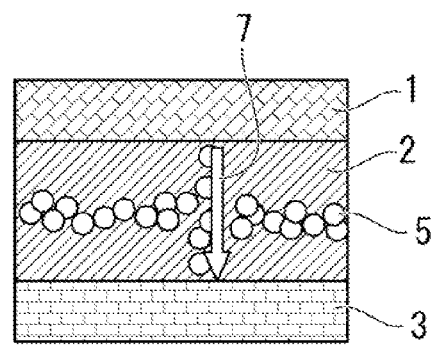
FIG. 9B is a view for explaining an effect according to the embodiment of the present invention.

Effects of the embodiment of the present invention will be described with reference to FIGS. 9A, 9B and 9C. As shown in FIG. 9A, metal vacancies are distributed at a center portion of the NiO layer. The resistance change material layer 2 has a three-layer structure in which a center layer has a high oxygen concentration and a region in contact with the upper electrode 1 and the lower electrode 3 has a substantially stoichiometric composition, thereby accomplishing the following effect. That is, as shown in FIG. 6A, compared to the case in which the metal vacancies 5 are uniformly distributed in the resistance change material layer 2, a leak current in an ON state can be substantially suppressed by the NiO layer having a substantially stoichiometric composition and being adjacent to the upper electrode 1 and the lower electrode 3, thereby increasing a resistance value in an OFF state.

As a result, a resistance value in the ON/OFF states can be obtained. In addition, as shown in FIG. 9B, a filament for a switching operation can be formed by the metal vacancies 5 locally distributed at a center portion of the resistance change material layer 2. For this reason, it is possible to switch the MIM resistance change element to the ON state even at a low forming voltage.

Figure 9C:
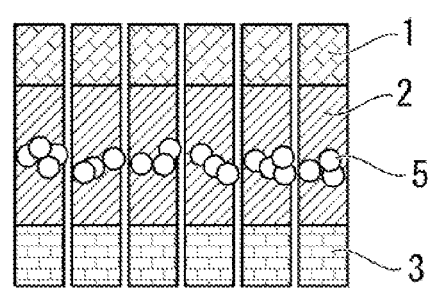
FIG. 9C is a view for explaining an effect according to the embodiment of the present invention.

Moreover, as shown in FIG. 9C, since the metal vacancies 5 are locally distributed in a depth direction of the resistance change material layer 2, imbalance of Ni vacancy concentration in the resistance change material layer 2 cannot be easily generated even when the element is miniaturized. For this reason, imbalance of switching characteristics can be suppressed. In addition, since the NiO layer adjacent to the upper electrode 1 and the lower electrode 3 has a substantially stoichiometric composition, the atomic density is high. For this reason, damage to the electrodes upon formation thereof and reliability deterioration of the MIM resistance change element due to diffusion of the electrode metal in the NiO layer can be suppressed.

A thickness of each layer of the nickel oxide constituting the resistance change material layer 2 is adjusted according to the combination of composition ratios of the layers to be optimized with respect to the forming voltage set according to a use of the switch element or the resistance ratio of the ON/OFF states. Meanwhile, a thickness of the entire resistance change material layer 2 may be set within a range of 200 nm to 5 nm. More preferably, the thickness is set to 100 nm or less in consideration of processing of an element shape and 5 nm or more in consideration of uniformity of the layer. More preferably, the thickness is set to 60 nm or less in consideration of uniform filling into fine holes and 10 nm or more in consideration of reliability.

While the upper electrode 1 and the lower electrode 3 may be formed of different electrode materials, preferably, the upper electrode 1 and the lower electrode 3 may be formed of the same material. The upper electrode 1 and the lower electrode 3 may be formed of a metal selected from the group consisting of Pt, Ir, Ru, Ti, TaW, and Cu, or an oxide or nitride thereof. More preferably, the upper electrode 1 and the lower electrode 3 may be formed of a metal, a metal oxide and a metal nitride selected from the group consisting of Ru, $RuO_2$, Ti, TiN, Ta, TaN, W, WN, and Cu.

These electrode materials may be easily processed using a dry etching or chemical mechanical polishing (CMP) technique, which may be compatible with a conventional LSI manufacturing process. More preferably, the upper electrode 1 and the lower electrode 3 may be formed of a material selected from the group consisting of Ta, TaN and Cu. These materials are used in an interconnection process of the LSI manufacturing process. Using these materials, it is possible to remarkably reduce manufacturing cost for mounting the semiconductor memory element according to the embodiment on the LSI.

More preferably, Cu is used as a material of the upper electrode 1, the lower electrode 3 and an electrode for reset. By using Cu for the upper electrode 2 and the lower electrode 3, the interconnection of the LSI can function as the electrode of the MIM resistance change element. In addition, improvement of performance and a reduction in manufacturing cost of the MIM resistance change element can be simultaneously realized by a reduction in resistance ratio of the electrode.

EXAMPLES

Hereinafter, examples according to the present invention will be described with reference to the accompanying drawings.

First Example

Figure 12A:
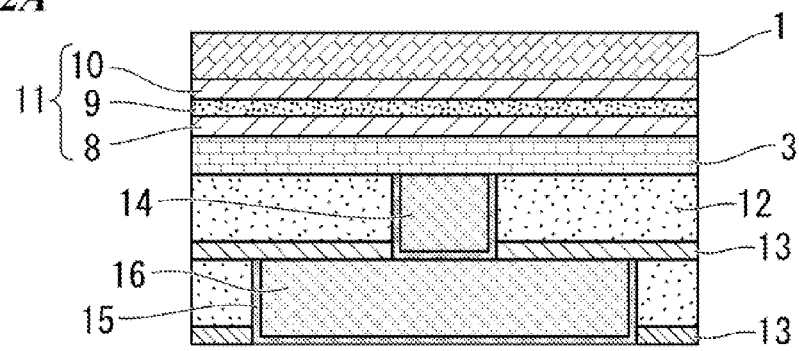
FIG. 12A is a cross-sectional view showing a process of manufacturing an MIM resistance change element according to a first example of the present invention.
Figure 12B:
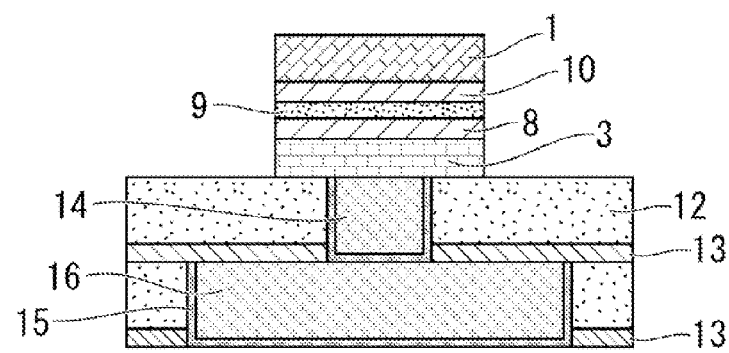
FIG. 12B is a cross-sectional view showing the process of manufacturing an MIM resistance change element according to the first example of the present invention.
Figure 12C:
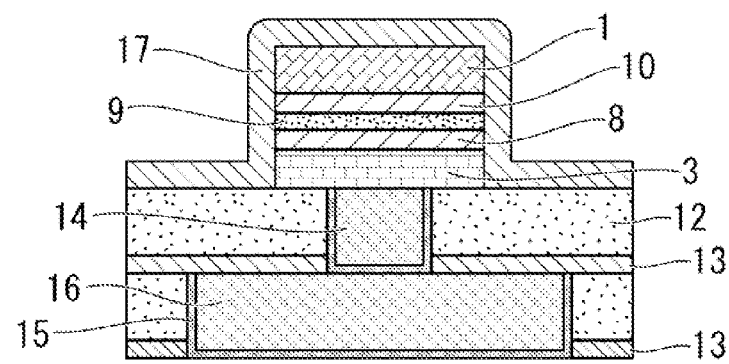
FIG. 12C is a cross-sectional view showing the process of manufacturing an MIM resistance change element according to the first example of the present invention.
Figure 12D:
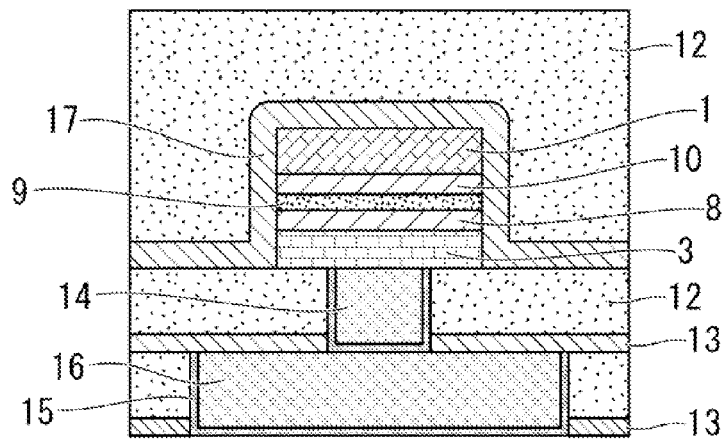
FIG. 12D is a cross-sectional view showing the process of manufacturing an MIM resistance change element according to the first example of the present invention.
Figure 12E:
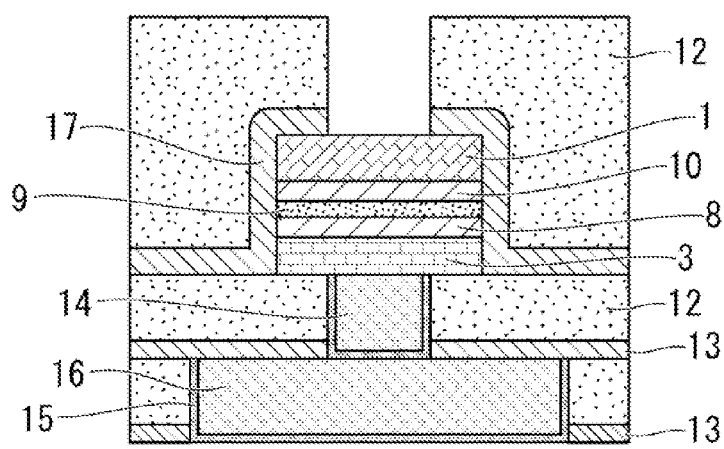
FIG. 12E is a cross-sectional view showing the process of manufacturing an MIM resistance change element according to the first example of the present invention.
Figure 12F:
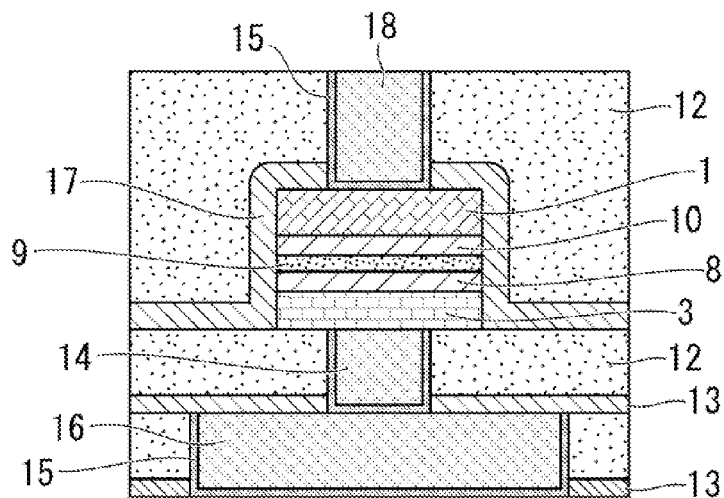
FIG. 12F is a cross-sectional view showing the process of manufacturing an MIM resistance change element according to the first example of the present invention.

In the first example of the present invention, a basic constitution of an MIM resistance change element is shown in FIG. 12F. FIGS. 12A to 12F are cross-sectional views showing a process of manufacturing the MIM resistance change element according to the present invention. FIGS. 12A to 12F show the process of forming the MIM resistance change element in an interconnection layer of an LSI formed of a CMOS transistor.

First, as shown in FIG. 12A, a lower interconnection 16 and a lower via interconnection 14 connected to the lower interconnection 16 are formed using a chemical mechanical polishing (CMP) technique and an electroplating technique. The lower interconnection 16 and the lower via interconnection 14 are formed of Cu. An interlayer insulating layer 12 is a silicon oxide layer formed by a CVD technique. In order to prevent reaction of the lower interconnection 16 and the lower via interconnection 14 with the interlayer insulating layer 12 and peeling-off thereof, an interconnection protective layer 13 and an interconnection interlayer protective layer 15 are formed at an interface thereof. The interconnection protective layer 13 is formed of silicon carbonitride (SiCN). The interconnection interlayer protective layer 15 is formed of a stacked layer of tantalum (Ta) and tantalum nitride (TaN). After forming the lower via interconnection 14, the surface of the lower via interconnection 14 is exposed by CMP simultaneously with planarization.

After that, a lower electrode 3, a resistance change material layer 11 and an upper electrode 1 of an MIM memory element are formed. While the upper electrode 1 and the lower electrode 3 may be formed of different materials, preferably, the upper electrode 1 and the lower electrode 3 may be formed of the same material. Electrodes of the upper electrode 1 and the lower electrode 3 may be formed of a metal selected from the group consisting of Pt, Ir, Ru, Ti, TaW, and Cu, or an oxide or nitride thereof. In this example, for the convenience of machinability, both of the upper electrode 1 and the lower electrode 3 are formed of Ru. Ru for forming the upper electrode 1 and the lower electrode 3 may be deposited by sputtering.

The resistance change material layer 11 is formed of a NiO layer having a stacked structure whose composition is controlled. The nickel oxide enables a switching operation even in a polycrystalline or amorphous structure. However, in consideration of uniformity of the layer, the nickel oxide may be amorphous. The stacked structure of the NiO layer may be a two-layer structure, preferably, a three-layer structure. Since the NiO layer has a three-layer structure, in which the NiO layer adjacent to the electrodes has a substantially stoichiometric composition, the atomic density is increased, and damage to the electrodes upon formation thereof and reliability deterioration of the MIM resistance change element due to diffusion of the electrode metal in the NiO layer can be suppressed.

As shown in FIG. 12A, the element includes a first layer 8 in contact with the lower electrode 3, a second layer 9 formed on and in contact with the first layer 8, and a third layer 10 formed on the second layer 9 and in contact with the upper electrode 1. The first layer 8 and the third layer 10 are set to have the same oxygen concentration, and the second layer 9 is set to have an oxygen concentration higher than that of the first layer 8 and the third layer 10.

When a composition ratio of the resistance change material layer 11 formed of the nickel oxide is represented as $Ni_xO_{1-x}$ (0<X<1), the first layer 8 and the third layer 10 have a composition ratio of 0.45<X<0.49 and the second layer 9 has a composition ratio of 0.40<X<0.47.

More preferably, the first layer 8 and the third layer 10 have a composition ratio of 0.48<X<0.49 and the second layer 9 has a composition ratio of 0.450<X<0.475.

The relationship between the composition ratio and the atomic density of the nickel oxide is unambiguously determined, regardless of a film forming method such as CVD, PVD, and so on, or postdeposition annealing (PDA). As shown in FIG. 10, as an oxygen concentration of the composition ratio increases, the atomic density of the nickel oxide is lowered. This is because Ni vacancy is generated in the nickel oxide of the stoichiometric composition. Therefore, when the resistance change material layer 11 formed of the nickel oxide has a three-layer structure including the first layer 8 in contact with the lower electrode 3, the second layer 9 formed on and in contact with the first layer 8, and the third layer 10 formed on the second layer 9 and in contact with the upper electrode 1, the atomic density may be set as follows. That is, when the composition ratio of the resistance change material layer 11 formed of the nickel oxide is represented as $Ni_xO_{1-x}$ (0<X<1), in a case where the composition ratio of the first layer 8 and the third layer 10 have a range of 0.45<X<0.49 and the composition ratio of the second layer 9 has a range of 0.40<X<0.47, the atomic density of the first layer 8 and the third layer 10 may be set to a range of 5.2 to 6.9 $g/cm^3$ and the atomic density of the second layer 9 may be set to a range of 4.2 to 6.3 $g/cm^3$.

More preferably, when the composition ratio of the first layer 8 and the third layer 10 has a range of 0.48<X<0.49 and the composition ratio of the second layer 9 has a range of 0.450<X<0.475, the atomic density of the first layer 8 may be set to a range of 6.1 to 6.9 $g/cm^3$ and the atomic density of the second layer 9 may be set to a range of 5.2 to 6.5 $g/cm^3$.

A thickness of each layer of the nickel oxide constituting the resistance change material layer 11 is adjusted according to the combination of composition ratios of the layers to be optimized with respect to the forming voltage set according to a use of the switch element or the resistance ratio of the ON/OFF states. Meanwhile, a thickness of the entire resistance change material layer 11 may be set within a range of 200 nm to 5 nm. More preferably, the thickness is set to 100 nm or less in consideration of processing of an element shape and 5 nm or more in consideration of uniformity of the layer. More preferably, the thickness is set to 60 nm or less in consideration of uniform filling into fine holes and 10 nm or more in consideration of reliability.

Figure 11:
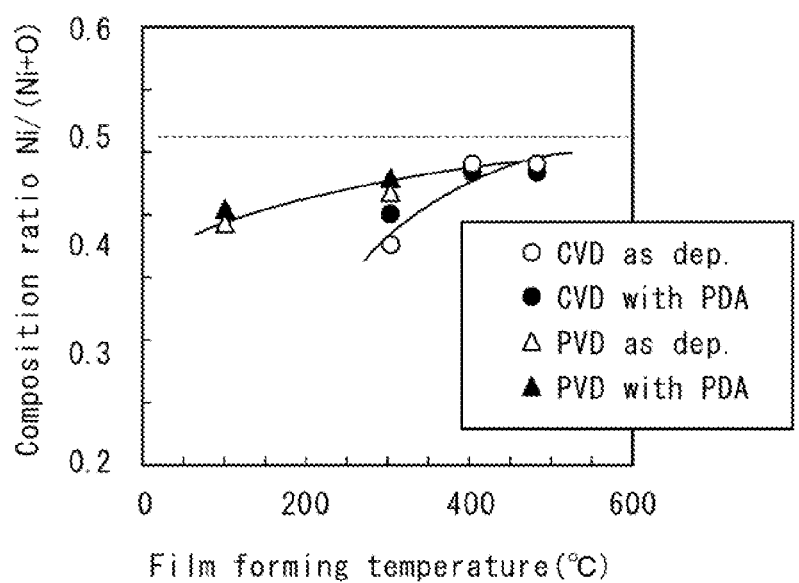
FIG. 11 is a graph showing the relationship between a layer forming temperature and a composition ratio of a nickel oxide according to the embodiment of the present invention.

The nickel oxide can be formed by PVD or CVD. As shown in FIG. 11, the composition can be controlled by a film forming temperature or PDA. In addition, in consideration of uniform filling into fine holes, the nickel oxide may be formed by CVD. A source gas including Ni metal is regulated by a mass flow controller to be supplied onto a silicon substrate heated to a predetermined temperature together with an oxidation gas via a shower head, thereby forming a NiO layer. The source gas including Ni metal may contain an organic metal-based gas, bis-methyl cyclopentadienyl nickel ((Ni $(CH_3C_5H_4)_2$:(MeCp)$_2$Ni). (MeCp)$_2$Ni source gas is easily decomposed by a molecular oxidation gas at a relatively low temperature, so that diffusion of the carbon into the deposited NiO layer is very low. Further, by varying the forming temperature, the composition and film density of the NiO layer can be controlled. $N_2$ is used as a carrier gas and $O_2$ is used as an oxidation gas. A silicon substrate is heated by a heater via a susceptor. A temperature of the substrate is set to a range of 200° C. to 500° C. When the substrate temperature is 200° C. or less, the source gas is not decomposed, a film forming rate is reduced, and uniformity of the NiO layer in a wafer surface is deteriorated. For this reason, problems related to throughput and yield in mass production may occur.

Meanwhile, in consideration of thermal resistance of an interconnection layer, it is necessary to set the substrate temperature upon film forming to 500° C. or less. Moreover, the film density and composition of the NiO layer by the (MeCp)$_2$Ni source gas can be controlled using the substrate temperature.

FIG. 11 is a graph showing the relationship between a film forming temperature and a composition ratio. As the film forming temperature increases, the density of the NiO layer also increases to be close to a theoretical value of a NiO crystal. As described above, a predetermined composition of a NiO layer can be formed by varying the film forming temperature. A film forming pressure is set to a range of 0.001 Torr to 100 Torr. Preferably, the film forming pressure is set to a range of 0.1 Torr to 10 Torr. More preferably, the film forming pressure is set to a range of 1.5 Ton to 2.5 Torr.

Next, as shown in FIG. 12B, an upper electrode 1 formed of Ru, a resistance change material layer 11 formed of a NiO layer, and a lower electrode 3 formed of Ru are processed in a predetermined shape using a dry etching technique.

Next, as shown in FIG. 12C, a portion of the upper electrode 1 is removed by selectively etching the NiO layer to expose a portion of the surface of the NiO layer. While selective etching can be performed by dry etching or wet etching, the wet etching may be performed to prevent damage to the NiO layer.

Next, as shown in FIG. 12C, a protective layer 17 is formed to protect side surfaces of the MIM resistance change element. As shown in FIG. 12D, the protective layer 17 functions as an adhesion layer to prevent the upper electrode 1 and the interlayer insulating layer 12 from being peeled off. The protective layer 17 is an insulating layer, and uses a material having good and stable adhesion with the upper electrode 1, the lower electrode 3, the resistance change material layer 11 and the interlayer insulating layer 12 of the MIM resistance change element. For example, the protective layer 17 may be formed of a silicon nitride (SiN) layer.

Next, as shown in FIG. 12E, a contact hole is formed in the upper electrode 1 to form an upper via interconnection 18 using a CMP technique and an electroplating technique.

Second Example

Figure 13A:
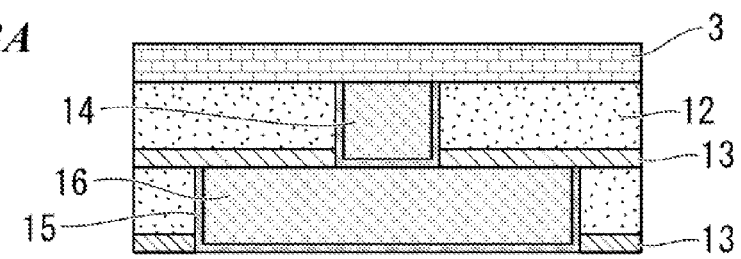
FIG. 13A is a cross-sectional view showing a process of manufacturing an MIM resistance change element according to a second example of the present invention.
Figure 13B:
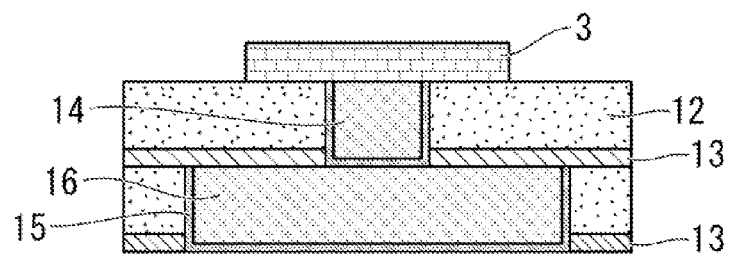
FIG. 13B is a cross-sectional view showing the process of manufacturing an MIM resistance change element according to the second example of the present invention.
Figure 13C:
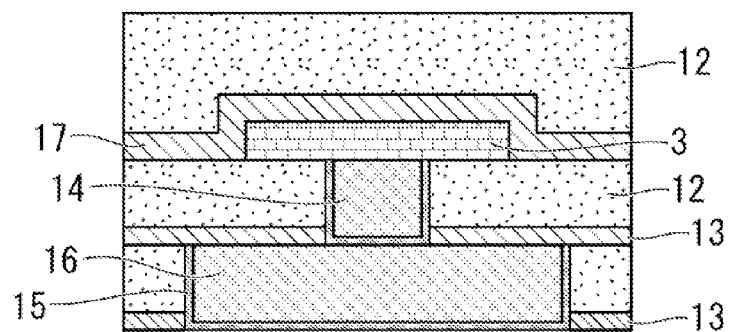
FIG. 13C is a cross-sectional view showing the process of manufacturing an MIM resistance change element according to the second example of the present invention.
Figure 13D:
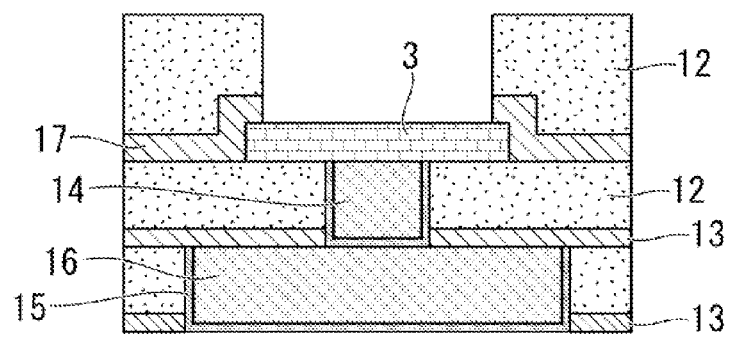
FIG. 13D is a cross-sectional view showing the process of manufacturing an MIM resistance change element according to the second example of the present invention.
Figure 13E:
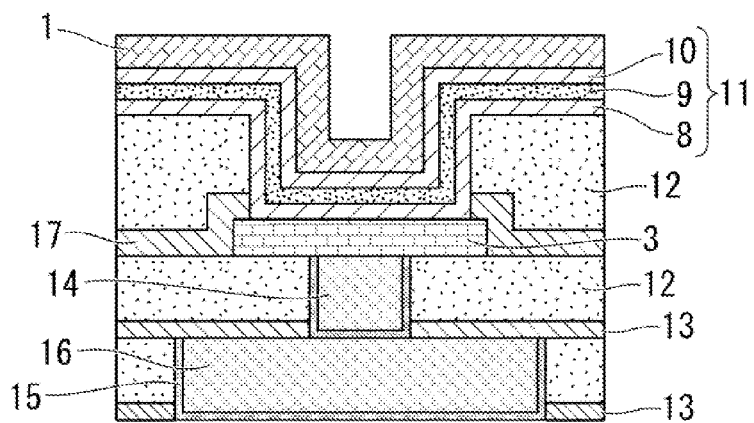
FIG. 13E is a cross-sectional view showing the process of manufacturing an MIM resistance change element according to the second example of the present invention.
Figure 13F:
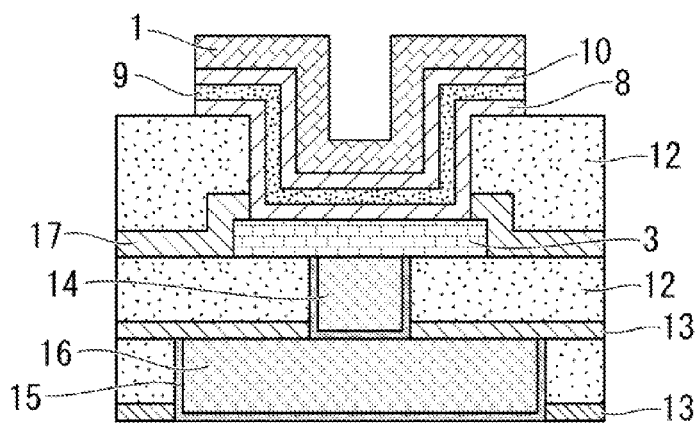
FIG. 13F is a cross-sectional view showing the process of manufacturing an MIM resistance change element according to the second example of the present invention.
Figure 13G:
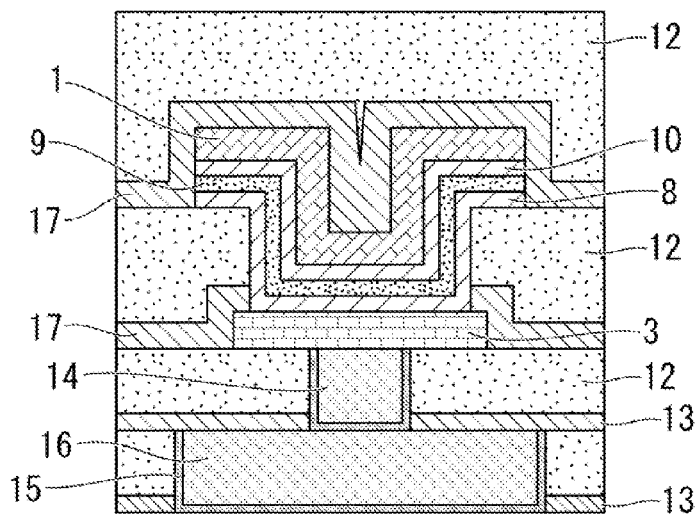
FIG. 13G is a cross-sectional view showing the process of manufacturing an MIM resistance change element according to the second example of the present invention.

A structure according to the second example of the present invention, in which an MIM resistance change element is filled in a contact hole formed in an interlayer insulating layer of an LSI interconnection, is shown in FIG. 13G. FIGS. 13A to 13G are cross-sectional views showing a process of manufacturing an MIM resistance change element according to an example of the present invention. FIGS. 13A to 13G are cross-sectional views showing a process of manufacturing an MIM resistance change element on an interconnection layer of an LSI formed of a CMOS transistor.

First, as shown in FIG. 13A, a lower interconnection 16 and a lower via interconnection 14 connected to the lower interconnection 16 are formed by a CMP technique and an electroplating technique. In addition, a lower electrode 3 of the MIM resistance change element is formed on the lower via interconnection 14. The above steps of the manufacturing process are the same as in the first example, and thus, descriptions thereof are omitted.

Next, as shown in FIG. 13B, the lower electrode 3 is processed in a predetermined shape by a dry etching technique. While the lower electrode 3 may be formed of a different material than an upper electrode 1, which will be formed through the following process, preferably, the upper electrode 1 is formed of the same material as the lower electrode 3. The upper electrode 1 and the lower electrode 2 may be formed of a metal selected from the group consisting of Pt, Ir, Ru, Ti, TaW, and Cu, or an oxide or nitride thereof. In this example, for the convenience of machinability, both of the lower electrode 3 and the upper electrode 1, which will be formed by the following process, are formed of Ru. Ru for forming the upper electrode 1 and the lower electrode 3 may be deposited by sputtering.

Next, as shown in FIG. 13C, a protective layer 17 is formed to protect the surface of the lower electrode 3. Then, an interlayer insulating layer 12 is formed. The protective layer 17 functions as an adhesion layer to prevent the lower Ru electrode 3 and the interlayer insulating layer 12 from being peeled off. The protective layer 17 is an insulating layer. The protective layer 17 is formed of a material having good adhesion and stability with the lower electrode 3 of the MIM resistance change element and the resistance change material to be formed by the following process. For example, the protective layer 17 may be formed of a silicon nitride (SiN) layer.

Next, as shown in FIG. 13D, predetermined regions of the interlayer insulating layer 12 and the protective layer 17 are removed to form a contact hole on the lower electrode 3 using a dry etching technique. The contact hole is formed to be in contact with only the surface of the lower electrode 3, without contacting other interconnections.

Next, as shown in FIG. 13E, the resistance change material layer 11 and the upper electrode 1 are formed.

The resistance change material layer 11 is formed of a NiO layer having a stacked structure whose composition is controlled. The nickel oxide enables a switching operation even in a polycrystalline or amorphous structure. However, in consideration of uniformity of the layer, the nickel oxide may be amorphous. The stacked structure of the NiO layer may be a two-layer structure, preferably, a three-layer structure.

As shown in FIG. 13E, the layer 11 includes a first layer 8 in contact with the lower electrode 3, a second layer 9 formed on and in contact with the first layer 8, and a third layer 10 formed on the second layer 9 and in contact with the upper electrode 1. The first layer 8 and the third layer 10 are set to have the same oxygen concentration, and the second layer 9 is set to have a higher oxygen concentration than the first layer 8 and the third layer 10. When a composition ratio of the resistance change material layer 11 formed of the nickel oxide is represented as $NiO_xO_{1-x}$ ($0<X<1$), the first layer 8 and the third layer 10 have a composition ratio of $0.45<X<0.49$ and the second layer 9 has a composition ratio of $0.40<X<0.47$.

More preferably, the first layer 8 and the third layer 10 have a composition ratio of $0.48<X<0.49$ and the second layer 9 has a composition ratio of $0.450<X<0.475$. Since the manufacturing process of the NiO layer is the same as the first example, descriptions thereof are omitted.

Next, as shown in FIG. 13F, the upper electrode 1 and the resistance change material layer 11 formed of the NiO layer are processed in a predetermined shape using a dry etching technique.

Next, as shown in FIG. 13G, a protective layer 17 is formed to protect side surfaces of the MIM resistance change element. In addition, an interlayer insulating layer 12 is formed on the protective layer 17. The protective layer 17 functions as an adhesion layer to prevent the upper electrode 1 and the interlayer insulating layer 12 from being peeled off. The protective layer 17 is an insulating layer. The protective layer 17 is formed of a material having good adhesion and stability with the upper electrode 1, the lower electrode 3, the resistance change material layer 11 and the interlayer insulating layer 12 of the MIM resistance change element. For example, the protective layer 17 may be formed of a silicon nitride (SiN) layer.

Figure 13H:
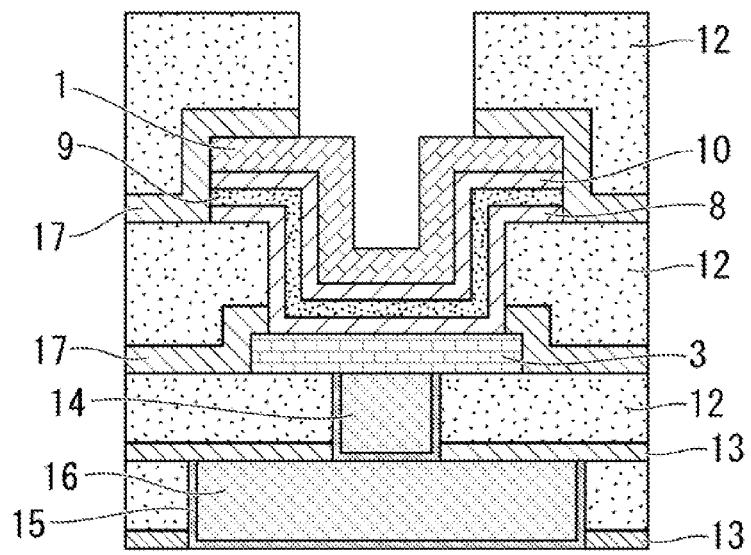
FIG. 13H is a cross-sectional view showing the process of manufacturing an MIM resistance change element according to the second example of the present invention.
Figure 13I:
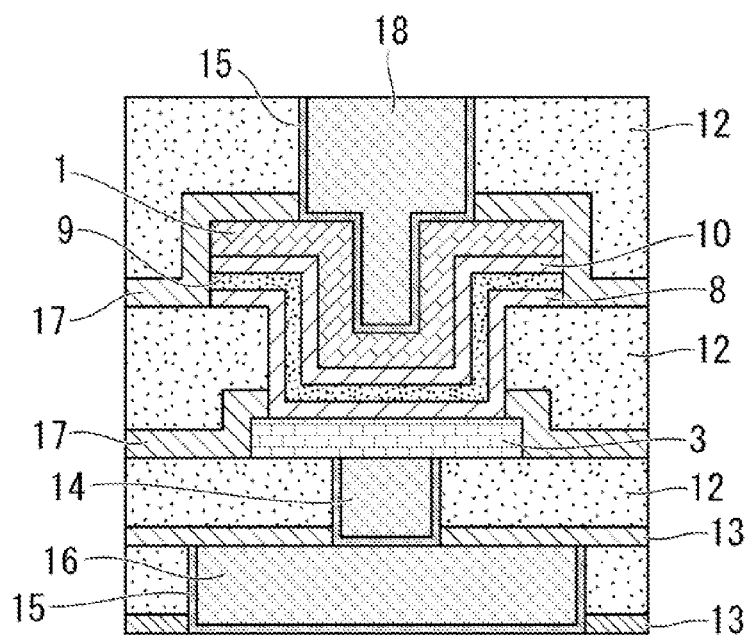
FIG. 13I is a cross-sectional view showing the process of manufacturing an MIM resistance change element according to the second example of the present invention.

Next, as shown in FIGS. 13H and 13I, an upper via interconnection 18 is formed in the upper electrode 1 via a contact hole using a CMP technique and an electroplating technique. The MIM resistance change element has the same structure as the example so that the resistance change material of the MIM resistance change element is not damaged during the dry etching process and the switching characteristics and reliability of the MIM resistance change element can be improved.

Third Example

Figure 14A:
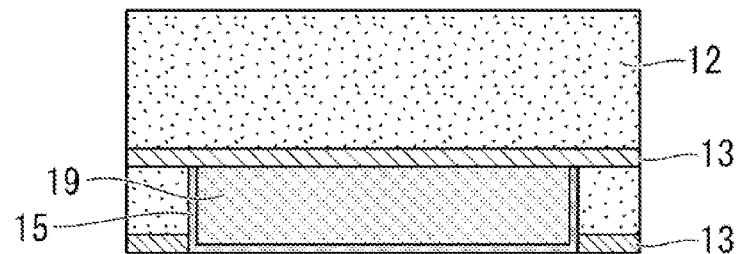
FIG. 14A is a cross-sectional view showing a process of manufacturing an MIM resistance change element according to a third example of the present invention.

A structure according to the third example of the present invention, in which an MIM resistance change element is filled in a contact hole formed in an interlayer insulating layer of an LSI interconnection so that an upper electrode and a lower electrode of the MIM resistance change element are in common with the LSI interconnection, is shown in FIG. 14I. FIGS. 14A to 14I are cross-sectional views showing a process of manufacturing an MIM resistance change element according to an example of the present invention. FIGS. 14A to 14I show a process of manufacturing an MIM resistance change element on an interconnection layer of an LSI formed of a CMOS transistor.

First, as shown in FIG. 14A, a lower interconnection 19 is formed using a CMP technique and an electroplating technique. Since the manufacturing process is the same as in the first example, descriptions thereof are omitted.

In this example, the lower interconnection 19, which functions as a lower electrode of the MIM resistance change element, is a lower electrode interconnection. The lower electrode 19 of the MIM resistance change element of the example is formed of Cu.

Figure 14B:
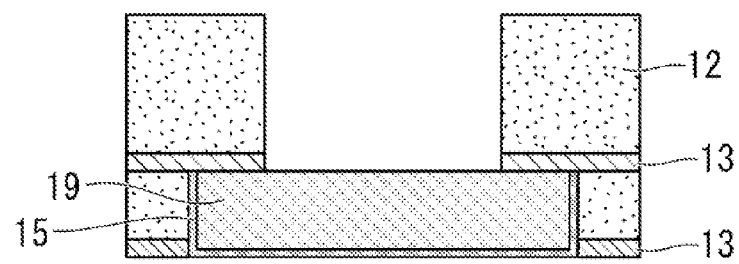
FIG. 14B is a cross-sectional view showing the process of manufacturing an MIM resistance change element according to the third example of the present invention.

Next, as shown in FIG. 14B, predetermined regions of an interlayer insulating layer 12 and a protective layer 13 are removed using a dry etching technique. In addition, a contact hole is formed on the lower electrode 19. The contact hole is formed to be in contact with only the surface of the lower electrode 19 without contacting other interconnections.

Figure 14C:
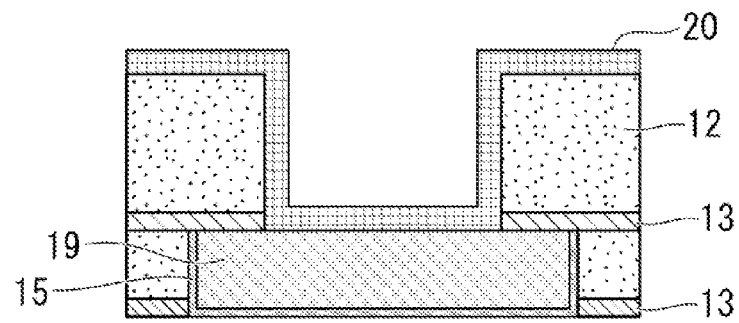
FIG. 14C is a cross-sectional view showing the process of manufacturing an MIM resistance change element according to the third example of the present invention.

Next, as shown in FIG. 14C, an interface layer 20 is formed to protect the interlayer insulating layer 12 and to increase adhesion with a resistance change material layer 11. The interface layer 20 is an insulating layer. The interface layer 20 is formed of a material having good adhesion and stability with the interlayer insulating layer 12 and the resistance change material layer 11. For example, the interface layer 20 may be formed of a metal oxide, a metal nitride, or a silicon nitride (SiN) having no resistance change characteristics.

Figure 14D:
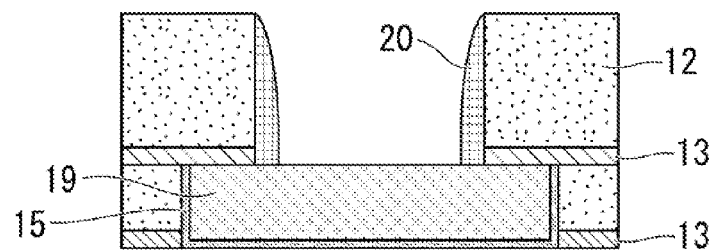
FIG. 14D is a cross-sectional view showing the process of manufacturing an MIM resistance change element according to the third example of the present invention.

Next, as shown in FIG. 14D, the interface layer 20 is left only on a sidewall of the contact hole using a dry etching technique.

Figure 14E:
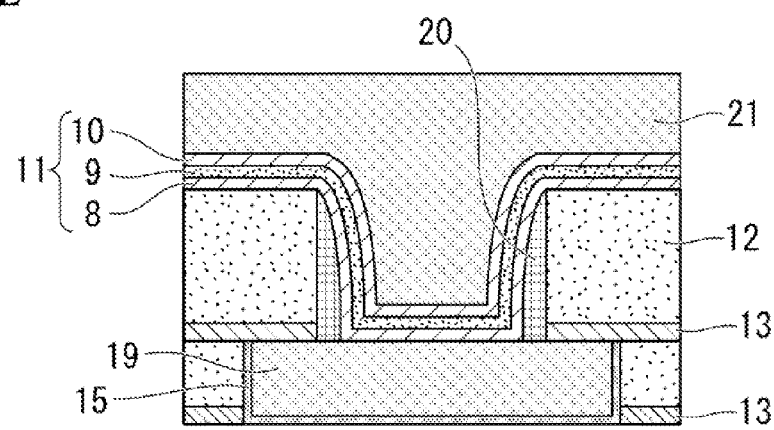
FIG. 14E is a cross-sectional view showing the process of manufacturing an MIM resistance change element according to the third example of the present invention.

Next, as shown in FIG. 14E, the resistance change material layer 11 and an upper electrode 21 are formed.

The resistance change material layer 11 is formed of a NiO layer having a stacked structure whose composition is controlled. The nickel oxide enables a switching operation even in a polycrystalline or amorphous structure. However, in consideration of uniformity of the layer, the nickel oxide may be amorphous. The stacked structure of the NiO layer may be a two-layer structure, preferably, a three-layer structure.

As shown in FIG. 14E, the resistance change material layer 11 includes a first layer 8 in contact with the lower electrode 19, a second layer 9 formed on and in contact with the first layer 8, and a third layer 10 formed on the second layer 9 and in contact with the upper electrode 21. The first layer 8 and the third layer 10 are set to have the same oxygen concentration, and the second layer 9 is set to have a higher oxygen concentration than the first layer 8 and the third layer 10. When a composition ratio of the resistance change material layer 11 formed of the nickel oxide is represented as $Ni_xO_{1-x}$ ($0<X<1$), the first layer 8 and the third layer 10 have a composition ratio of $0.45<X<0.49$ and the second layer 9 has a composition ratio of $0.40<X<0.47$.

More preferably, the first layer 8 and the third layer 10 have a composition ratio of $0.48<X<0.49$ and the second layer 9 has a composition ratio of $0.450<X<0.475$. Since the manufacturing process of the NiO layer is the same as in the first example, descriptions thereof are omitted.

The upper electrode 21 is in common with a via interconnection. The upper electrode 21 is formed of Cu using an electroplating technique.

Next, the remaining resistance change material, the NiO layer to which phosphorus is added, and the upper electrode 21 are polished to be planarized using CMP.

Next, an interconnection protective layer 13 and an interlayer insulating layer 12 are formed on the upper electrode 21. In addition, a trench of an interconnection pattern is formed through an etching process. Further, an upper interconnection is formed using a CMP technique and an electroplating technique. The MIM resistance change element can be incorporated into the via interconnection of the interconnection layer by applying the process of the example. The electrode of the MIM resistance change element is in common with the interconnection to improve switching characteristics due to a reduction in resistance of the electrode material, thereby reducing process costs and realizing high integration of the MIM resistance change element.

Figure 15:
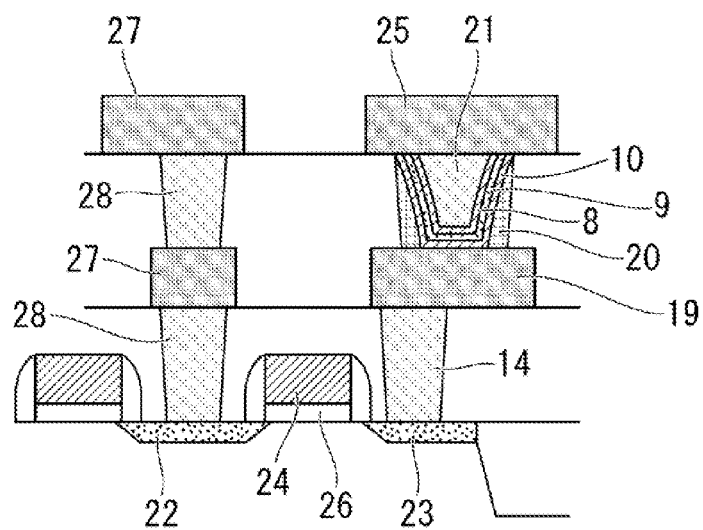
FIG. 15 is a cross-sectional view of the MIM resistance change element according to the third example of the present invention.

FIG. 15 is a view showing a combination of an MIM resistance change element and a MOS transistor according to an example of the present invention.

In FIG. 15, a via interconnection 28 is formed on a source diffusion layer region 22 of a MOS transistor. In addition, an interconnection 27 is formed on the via interconnection 28. Further, another via interconnection 28 is formed on the interconnection 27. Another interconnection 27 is formed on the via interconnection 28.

Furthermore, a lower via interconnection 14 is formed on a drain diffusion layer region 23 of the MOS transistor. In addition, the lower electrode 19, the interface layer 20, the first layer 8, the second layer 9, the third layer 10, and the upper electrode 21 are formed on the lower via interconnection 14. Further, an upper interconnection 25 of the MIM resistance change element is formed on the upper electrode 21.

In addition, a gate insulating film 26 of the MOS transistor is formed on a region between the source diffusion layer region 22 and the drain diffusion layer region 23. Further, a gate electrode 24 of the MOS transistor is formed on the gate insulating film 26.

In FIG. 15, the MIM resistance change element according to the example of the present invention is connected to the drain diffusion layer region of the MOS transistor via the Cu interconnection. As a result, high integration can be easily accomplished and a random access memory cell having non-volatility can be realized.

Although the embodiment of the present invention has been described in detail with reference to the accompanying drawings, a detailed configuration is not limited thereto. That is, various modifications can be made to the above-described embodiment of the present invention without departing from the scope of the present invention.

INDUSTRIAL APPLICABILITY

The present invention can be applied to a resistance change element capable of performing a forming process at a low voltage, providing reliability for a long time, and suppressing imbalance of an element having fine elements, and a manufacturing method thereof.

REFERENCE SYMBOLS

1: Upper electrode
2: Resistance change material layer
3: Lower electrode
4: Current path
5: Metal vacancy
6: Leak current
7: Current
8: First layer
9: Second layer
10: Third layer
11: Resistance change material layer
12: Interlayer insulating layer
13: Protective layer
14: Lower via interconnection
15: Protective layer
16: Lower interconnection
17: Protective layer
18: Upper via interconnection
19: Lower electrode
20: Interface layer
21: Upper electrode
22: Source diffusion layer region
23: Drain diffusion layer region
24: Gate electrode
25: Upper interconnection
26: Gate insulating film
27: Interconnection
28: Via interconnection

The invention claimed is:

1. A resistance change element comprising:
a lower electrode formed on at least one of a semiconductor and insulating substrate;
a resistance change material layer formed on the lower electrode and comprising transition metal oxide as a major component; and
an upper electrode formed on the resistance change material layer,
wherein the resistance change material layer is formed of a nickel oxide containing nickel vacancy and having a higher oxygen concentration than a stoichiometric composition, and has a stacked structure with different composition ratios,
wherein the resistance change material layer comprises:
a first layer in contact with the lower electrode; and
a second layer formed on the first layer and in contact with the upper electrode, wherein the second layer has a higher oxygen concentration than the first layer,
wherein when a composition ratio of the resistance change material layer is represented as $Ni_xO_{1-x}$ ($0<x<1$),
the first layer has a composition ratio of $0.45<x<0.49$, and
the second layer has a composition ratio of $0.40<x<0.47$.

2. A resistance change element comprising:
a lower electrode formed on at least one of a semiconductor and insulating substrate;
a resistance change material layer formed on the lower electrode and comprising transition metal oxide as a major component; and
an upper electrode formed on the resistance change material layer,
wherein the resistance change material layer is formed of a nickel oxide containing nickel vacancy and having a higher oxygen concentration than a stoichiometric composition, and has a stacked structure with different composition ratios,
wherein the resistance change material layer comprises:
a first layer in contact with the lower electrode;
a second layer formed on and in contact with the first layer; and
a third layer formed on the second layer and in contact with the upper electrode, wherein the first layer and the third layer have the same oxygen concentration, and the second layer has a higher oxygen concentration than the first layer and the third layer,
wherein when a composition ratio of the resistance change material layer is represented as $Ni_xO_{1-x}$ ($0<x<1$),
the first layer and the third layer have a composition ratio of $0.45<x<0.49$, and
the second layer has a composition ratio of $0.40<x<0.47$.

* * * * *